United States Patent [19]

Fujita et al.

[11] 4,241,435
[45] Dec. 23, 1980

[54] ELECTRONIC TIMEPIECE OSCILLATOR CIRCUIT

[75] Inventors: Hiro Fujita; Akira Tsuzuki, both of Tokorozawa, Japan

[73] Assignee: Citizen Watch Co., Ltd., Tokyo, Japan

[21] Appl. No.: 81,588

[22] Filed: Oct. 3, 1979

[30] Foreign Application Priority Data

Oct. 6, 1978 [JP] Japan ............................ 53-123233

[51] Int. Cl.³ .................. G04C 19/00; G04B 17/12; H03B 27/00
[52] U.S. Cl. .................................... 368/85; 368/200; 331/47
[58] Field of Search ............... 58/23 R, 23 AC, 85.5, 58/24 R; 331/176, 46, 47

[56] References Cited

U.S. PATENT DOCUMENTS 4,159,622  3/1979  Akahane ................. 58/23 AC
4,173,862  11/1979 Nakagiri et al. ........... 58/23 AC Primary Examiner—Vit W. Miska
Attorney, Agent, or Firm—Jordan and Hamburg

[57] ABSTRACT

An electronic timepiece having a high frequency oscillator with a high level of frequency stability and an electronically controlled low frequency oscillator. The phase of a high frequency signal from the high frequency oscillator is compared with a signal from the low frequency oscillator, and a digital signal is produced in accordance with the phase difference. The digital signal alternately controls the frequency of the low frequency signal to be slightly greater than an exact submultiple of that of the high frequency signal and slightly less that an exact submultiple of the high frequency signal, so that with respect to a relatively long time interval the frequency of the low frequency signal is an exact submultiple of that of the high frequency signal, the low frequency signal being thereby utilizable as a timebase signal for the timepiece.

9 Claims, 8 Drawing Figures

ELECTRONIC TIMEPIECE OSCILLATOR CIRCUIT

BACKGROUND OF THE INVENTION

In designing a source of a unit time signal for an electronic timepiece, there are essentially two major points to be considered. One of these is power consumption, since, in the case of an electronic timepiece of small size such as a wristwatch, the battery which provides power is of small size and therefore of low capacity. In order to extend the lifetime of the battery as far as possible, therefore, the unit time signal must be produced with the consumption of a minimum of power. Another consideration is that of frequency stability and accuracy. Heretofore, it has been difficult to reconcile these two basic requirements. The unit time signal normally consists of a pulse train with a period of one second, generated by frequency-dividing a standard frequency timebase signal, usually produced by a quartz crystal-controlled oscillator circuit. The highest degree of frequency stability is obtained by using AT-cut quartz crystal vibrators operating at a frequency of the order of 4 Mhz or higher. However, the higher the frequency of the timebase signal applied to the frequency divider stages, the higher will be the power consumed by the frequency divider. For this reason, the timebase oscillator circuit of electronic timepieces at the present time generally utilize a quartz crystal vibrator with a frequency of the order of 32 kHz, as a compromise between the requirements for high frequency stability and low power consumption. Timebase oscillator circuits using higher frequencies are rarely utilized, because of the need to extend the operating life of the timepiece battery as far as possible. Some means is therefore desirable whereby the excellent frequency stability of a timebase oscillator circuit using a quartz crystal vibrator at a frequency of 4 MHz or more can be obtained, without the disadvantage of increased power consumption in the frequency divider stages. It is an objective of the present invention to provide such means.

SUMMARY OF THE INVENTION

With the present invention, a timebase signal of relatively low frequency is produced, which is stabilized in frequency with a relatively high frequency signal produced by a quartz crystal vibrator-controlled oscillator circuit of high frequency stability. Since it is not necessary to perform frequency division directly upon the high frequency oscillator signal, there is no danger of excessive power consumption in the frequency divider stages of the timepiece. And since the timebase signal is stabilized in frequency with that of the high frequency signal, an extremely high degree of frequency stability is obtained for the timebase signal. The method of stabilizing the relatively low frequency signal with the relatively high frequency signal is such that the relatively low frequency signal periodically is alternatley advanced and retarded in phase by an amount which is equal to one period of the high frequnecy signal. This has no effect upon the accuracy of the unit time signal which is derived from the timebase signal by frequency division.

DESCRIPTION OF THE PREFERRED EMBODIMENTS

Figure 1:
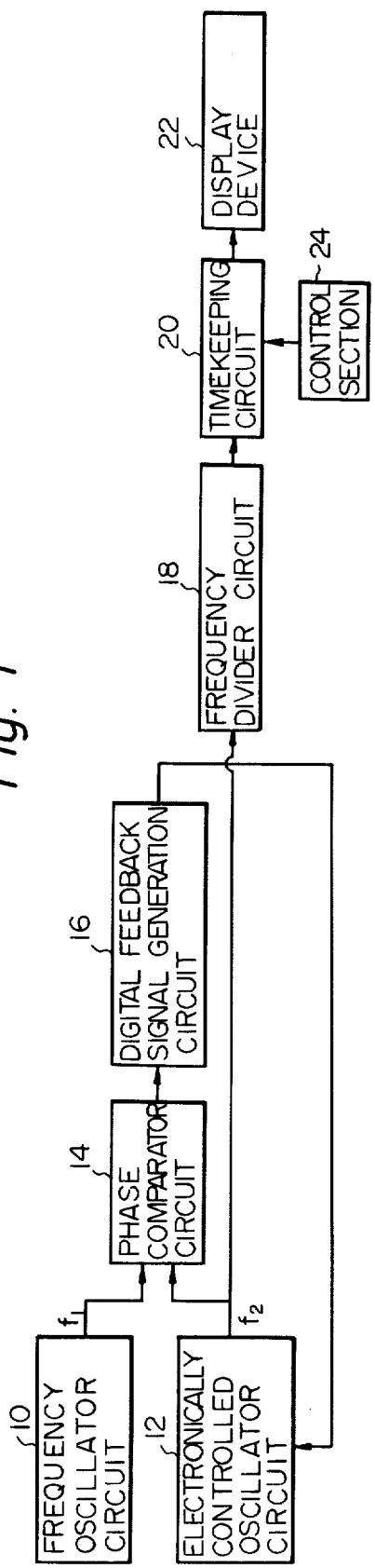
FIG. 1 is a block diagram of an embodiment of an electronic timepiece according to the present invention.
Figure 2:
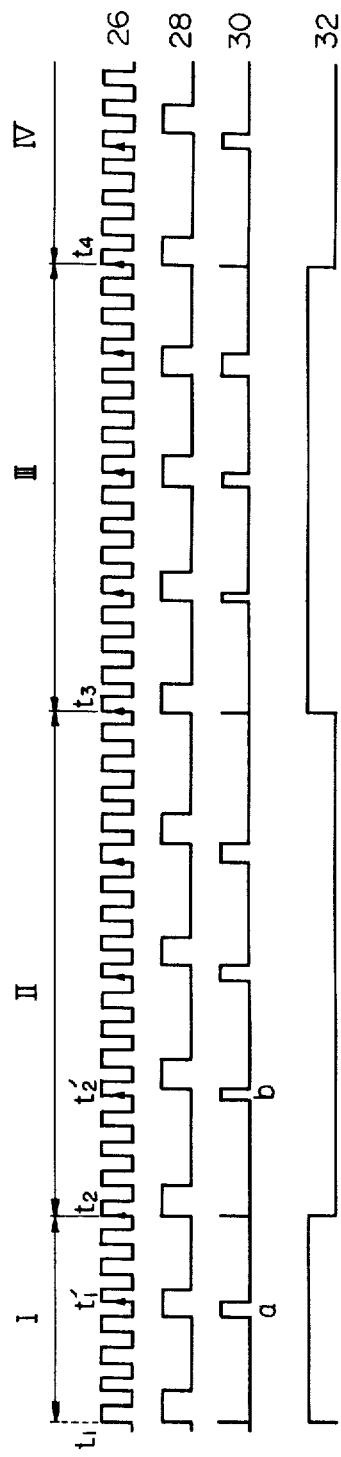
FIG. 2 is a waveform diagram illustrating the operation of the embodiment of FIG. 1.

FIG. 1 is a block diagram of an embodiment of an electronic timepiece according to the present invention. Waveforms indicating the operation of the timepiece of FIG. 1 are shown in FIG. 2. Reference numeral 10 denotes a source of a high frequency signal with a high degree of frequency stability, such as a high frequency oscillator circuit utilizing an AT-cut quartz crystal vibrator. The output frequency of signal source 10 is designated as $f_1$. Reference numeral 12 denotes an electronically controlled oscillator circuit which produces a relatively low frequency signal, whose frequency is designated as $f_2$. This relatively low frequency signal is used as a timebase signal by the timepiece. The relatively low and high frequency signals thus produced are compared in phase by a phase comparator circuit 14, which produces a phase comparison signal indicative of the phase difference between the relatively low and high frequency signals from circuits 12 and 10. For brevity, the relatively high frequency and relatively low frequency signal will be referred to hereinafter as the HF and LF signals, respectively. Reference numeral 16 denotes a digital feedback signal generation circuit, which generates a digital feedback signal varying between a high logic level potential and a low logic level potential. The digital feedback signal from circuit 16 is applied to electronically controlled oscillator circuit 12, such as to control the frequency of the LF signal in accordance with the phase relationship between the HF and LF signals, as will be described hereinafter. The LF signal is applied as a timebase signal to the frequency divider circuit of the timepiece, denoted by reference numeral 18, which produces a unit time signal. This unit time signal is applied to a timekeeping circuit 20, which thereby produces time information. This time information is displayed by a display device 22. Reference numeral 24 denotes a control section of the timepiece, including externally actuated control members and circuitry for performing correction of time information, etc.

The manner in which the LF signal is held stationary in frequency with the HF signal will now be explained, with reference to FIG. 2. In FIG. 2, the HF signal is designated by numeral 26, the LF signal by numeral 28, the magnitude of phase difference between the HF and LF signals (at each transition of the LF signal from the low logic level to the high logic level potential) is denoted by numeral 30, and the digital feedback signal which is applied to LF oscillator 12, by numeral 32. The frequency $f_2$ of the LF signal is controlled by the digital feedback signal such that one period of the LF signal corresponds to $(N \pm \alpha)$ periods of the HF signal, where N is an integer and $\alpha$ is a positive real number of magnitude less than one. It is not necessary that the frequency stability of the LF signal be extremely high, in other words, slight variations in $\alpha$ can occur without adverse effects upon the operation.

In FIG. 2, it is assumed that the phase of the LF signal has been lagging that of the HF signal prior to time $t_1$. The phase relationship between the HF signal and LF signal after time $t_1$ is changed from that attained prior to time $t_1$, the digital feedback signal 32 goes to the high logic level, in response to a phase comparison signal produced by the phase comparator circuit 14 (not shown in FIG. 2). In response to this high logic level of the digital feedback signal 32, the electronically controlled LF oscillator 12 causes the ratio $f_1/f_2$ to become $(N-\alpha_1)$, i.e. the frequency of the LF signal is increased slightly relative to $f_1/N$. The LF signal therefore begins to lead the HF signal in phase, after time $t_1$, as shown. In the example of FIG. 2, the LF signal has a frequency which is four times that of the HF signal (averaged over a relatively long time period), in other words, the value of N is 4. However, since the LF signal is now leading the HF signal, there is actually a phase difference of magnitude indicated by the letter a between them at time $t_1'$. Subsequently, at time $t_2$, the HF and LF signals again come into phase coincidence and phase relationship between HF and LF signals will vary after time $t_2$. As a result, a phase comparison signal is generated by phase comparator 14, causing the digital feedback signal 32 to go to the low logic level potential. In response to this, the electronically controlled LF oscillator 12 causes the frequency of the LF signal to be reduced with respect to $f_1/N$, by making this frequency $1/(N+\alpha_2)$ times that of the HF signal, where $\alpha_2$ is a positive real number less than one, which will generally be different from $\alpha_1$.

The phase of the LF signal will now begin to lag that of the HF signal. Thus, at time $t_2'$, if the LF signal and HF signal were in phase, the LF signal is actually lagging by an amount indicated by the letter b. Subsequently, at time $t_3$, the LF signal and the HF signal again come into phase coincidence. The phase comparator circuit therefore causes the digital feedback signal generator circuit 16 to generate a digital feedback signal 32 at the high logic level, thereby causing the phase of the LF signal to begin to lead that of the HF signal again. Subsequently, after time $t_4$, the frequency of the LF signal is again caused to decrease.

In the diagram of FIG. 2, it is assumed that the factor $\alpha_1$ is about $\frac{1}{2}$, and that the value of factor $\alpha_2$ is $\frac{1}{4}$. In other words, the value of the phase difference a in FIG. 2 is one half of a period of the HF signal, while the value of b is one quarter of a period of the HF = signal. The ratio of the frequency of the HF signal to that of the LF signal can therefore be expressed as $f_1/f_2 = (N-\alpha_1)$ during time period I in FIG. 2, and can be expressed as $f_1/f_2 = (N-\alpha_2)$ during time period II. The duration of the time periods I and II are such that the phase of the LF signal advances with respect to the HF signal by an amount equal to one period of the HF signal during period I, and is retarded in phase relative to the HF signal by an amount equal to one period of the HF signal during period II with respect to $f_1/N$. Thus, the average frequency of the LF signal over the total of time periods I and II is exactly equal to an integral submultiple of the frequency of the HF signal., i.e. the ratio of frequencies can be expressed as $f_1/f_2 = N$. The same is true for the average frequency of the LF signal over the two time periods III and IV, and so on for successive pairs of time periods.

In the example of FIG. 2, the digital feedback signal 32 varies between two logic level potentials. However it is also possible to utilize a digital feedback signal which varies between three or more potential levels, depending upon the particular circuit design of the timepiece.

It is not necessary for the LF signal to be stable to a very high degree, as will now be explained. During a time period such as period I in FIG. 2, when the frequency of the LF signal is higher than $f_1/N$, and an integral number of pulses, which we can denote as Ps, occur while a number n of pulses of the LF signal occur, with the relationship:

$$Ps = nN - 1$$

During a time period such as period II, when the frequency of the LF signal is lower than $f_1/N$, the integral number of pulses of the HF signal which occur during n pulses of the LF signal can be expressed as:

$$Po = nN + 1$$

There is a certain degree of instability of the LF signal permissible, so that the number of LF pulses occurring in a given time period need not be constant, but can be expressed as:

$$Ps = n_i N - 1$$

and $$Po = n_j N + 1$$

Thus, the number of pulses Pm of the HF signal which occur during two successive time periods (such as periods I and II) is expressed as:

$$Pm = (n_i + n_j)N$$

From this, it can be seen that the number of LF signal pulses which occur during these two successive time periods is given by:

$$n_i = n_j = Pm/N$$

In other words, the number of pulses of the LF signal which occur within a given time period is obtained by dividing the number of HF signal pulses which occur in that period by a constant, namely N.

The frequency stability required for the LF signal will now be discussed. Let us assume that the frequency of the HF signal is $f_1$, so that the period is $1/f_1$, which we can designate as Ts. The period of the LF signal will be designated as T. In this case the equation:

$$T \pm \Delta T = (N + \alpha + \Delta\alpha) \times Ts$$

holds true. The absolute value of $(\alpha + \Delta\alpha)$ should not exceed one, otherwise the value of N will be affected.

If we assume that a condition of phase coincidence, or a condition which is equivalent to phase coincidence occurs, then it is necessary that:

$$n\Delta T < Ts$$

$$T = (N + a) \times Ts$$

Therefore $$\frac{\Delta T}{T} < \frac{\frac{1}{n}}{N + a} = \frac{1}{n} \cdot \frac{f_2}{f_1}$$

The, since $f_2/f_1$ is almost equal to $1/N$, $$(\Delta T/T) < (1/nN)$$

The stability required for the LF signal is therefore dependant upon n and on N, which in turn are dependent on the frequency division ratio N, and upon the nominal value which has been predetermined for the LF signal.

Figure 3A:
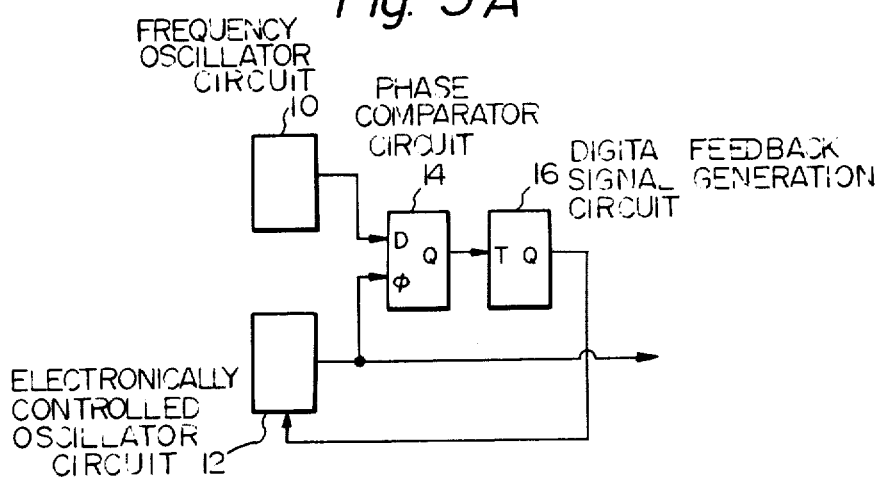
FIG. 3A is a block diagram of an embodiment of a timebase signal source according to the present invention, in which flip-flop circuits are used for phase comparison and digital feedback signal generation purposes.
Figure 3B:
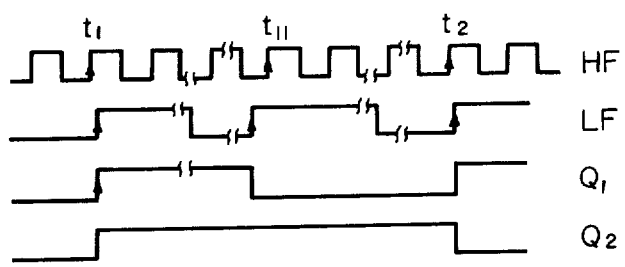
FIG. 3B is a waveform diagram for FIG. 3A.

A practical example of a timebase signal generation circuit according to the present invention will now be described, in block diagram form, as illustrated in FIG. 3A. The comparator 14 comprises a data-type flip-flop, and the digital feedback generator 16 comprises a toggle-type flip-flop, which performs $\div 2$ frequency division on the phase comparison signal which is produced by the phase comparator 14. The HF signal is applied to the data input terminal of the phase comparator 14, while the LF signal is applied to the clock terminal, designated as $\phi$. The toggle-type flip-flop 16 is particularly suitable especially when $n_i = n_j = 2$. The waveforms of the circuit of FIG. 3A are shown in FIG. 3B. At time $t_1$ in FIG. 3B, the HF signal is slightly advanced in phase, or almost identical in phase with the LF signal, so that the output of comparator 14, designated as Q, goes from the low to the high logic level when the LF signal rises to the high logic level at time $t_1$. As a result, the output of digital feedback signal generation circuit 16, denoted as Q2, goes from the low to the high logic level at time $t_1$. The high level digital feedback signal thus applied to electronically controlled LF oscillator 12 causes the frequency of the LF signal to be increased, as explained hereinabove with respect to the circuit of FIG. 1. As a result, subsequently at time $t_{11}$, the LF signal is leading the HF signal in phase so that the LF signal rises from the low to the high logic level at a time when the HF signal is at the low logic level. Thus, the output Q1 of comparator circuit 14 goes to the low logic level. Subsequently, at time $t_2$, the LF signal goes from the low to the high logic level at a time when the HF signal is at the high level, and the Q1 signal goes from the low to the high logic level, so that the output of digital feedback signal generation circuit 16 goes to the low logic level. As a result, the electronically controlled LF oscillator circuit 12 begins to decrease the frequency of the LF signal, after time $t_2$.

In the examples of FIG. 3A, the frequency of the LF signal is alternately increased and decreased during successive cycles of the output signal from digital feedback signal generation circuit 16. However it is also possible to arrange that the LF signal frequency is increased for a number of cycles of the phase comparator 14 output signal, and is then decreased for another number of cycles of the phase comparator output. This may be accomplished, for example, by utilizing a counter to receive the output of the phase comparator circuit, and applying the counter output signal to control the digital feedback signal generation circuit. Various other modifications to the circuit are possible, to provide various degrees of control of the LF signal frequency. However, it is an essential feature of the present invention that the control signal by which the LF signal is held stationary in frequency with the HF signal is a digital signal. The method of control of the present invention is therefore basically different from a conventional type of phase lock loop. In addition, the present invention provides the advantage that the degree of control of the LF signal need not be so high as in the case of a conventional phase lock loop circuit, since the frequency of the LF signal need only be controlled sufficiently to ensure that the value of N is held constant.

Figure 4:
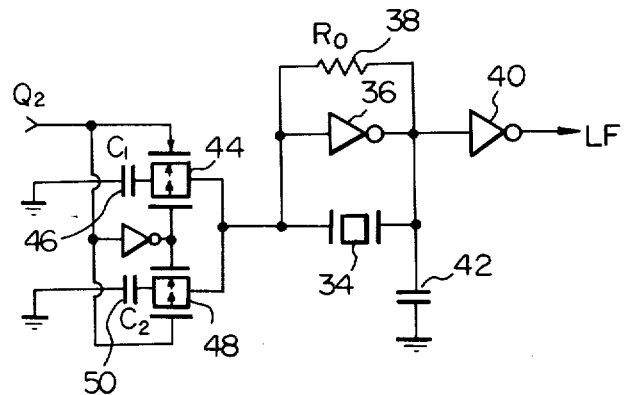
FIG. 4 is a circuit diagram of an embodiment of a relatively low frequency signal generating circuit comprising an electronically controlled crystal oscillator circuit.

Referring now to FIG. 4, a practical example of an electronically controllable LF oscillator circuit, in the form of a quartz crystal controlled oscillator circuit is shown. Here, numeral 34 denotes a quartz crystal vibrator capable of resonating within a frequency band which is lower than that of the HF signal, e.g. at frequencies of the order of 32 KHz for example. Inverters 36 and 40 perform amplification and wave-shaping functions respectively while numerals 44 and 48 denote transmission gates. A capacitor Co is connected from one terminal of quartz crystal vibrator 34 and the output of inverter 36 to ground. Either of two capacitors C1 and C2 can be selectively connected to the other terminal of quartz crystal vibrator 34 by means of transmission gates 44 and 48 respectively. When digital feedback control signal Q2 is at the high logic level, transmission gate 44 is enabled, so that capacitor C1 is connected between the input terminal of quartz crystal oscillator 34 and ground. When signal Q2 is at the low logic level, then capacitor 50 is connected between the input terminal of quartz crystal vibrator 34 and ground. The capacity C1 of capacitor 44 is less than the capacity C2 of capacitor 50, so that when signal Q2 is at the high logic level, the frequency of oscillation of the LF oscillator circuit will be modified by the combination of capacities Co and C1. The frequency of the LF signal is made higher than $f_1/N$, in this case. When signal Q2 is at the low logic level, then the frequency of oscillation is determined by the combination of capacities C2 and Co. In this case, the frequency of the LF signal is made less than that of $f_1/N$. Thus, the circuit of FIG. 4 serves as an electronically controlled LF oscillator circuit, performing the functions described for block 12 in FIG. 1 and FIG. 3A.

Figure 5A:
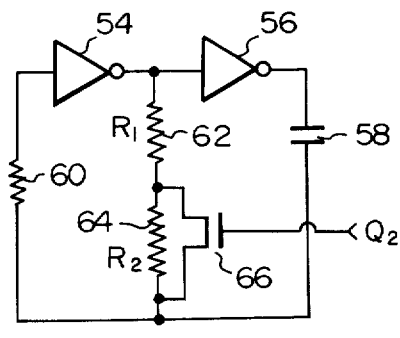
FIG. 5A and FIG. 5B show embodiments of relatively low frequency signal generating circuits comprising voltage controlled oscillator circuits.

An alternative form of LF oscillator circuit is shown in FIG. 5A. This is a voltage-controlled oscillator circuit, based on series-connected inverters 54 and 56, which can consist of CMOS inverters, or other suitable elements, and feedback performed by a capacitor 58 together with resistors 60, 62 and 64. An element such as an N-channel field effect transistor is connected across resistor 64, and is switchable to either an open circuit or short circuit condition in accordance with digital feedback control signal Q2 applied to a gate terminal. When signal Q2 causes FET 66 to go to the short circuit condition, so that resistor 62 is effectively connected between the junction of inverters 54 and 56 and the capacitor 58, then the frequency of the LF signal is made higher than $f_1/N$. When signal Q2 sets FET 66 to the open circuit condition, so that resistors 62 and 66 are connected in series between the junction of inverters 54 and 56 and capacitor 58, then the frequency of the LF is made lower than $f_1/N$. Thus, a circuit such as that of FIG. 5A can be utilized as an electronically controlled oscillator circuit corresponding to that denoted by numeral 12 in FIGS. 1 and 3.

Figure 5B:
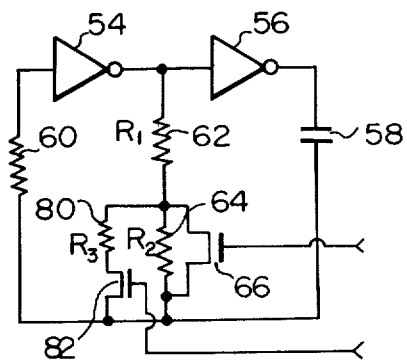

FIG. 5B shows a modified form of the voltage controlled oscillator of FIG. 5A, in which a resistor 80 is connected to the junction of resistors 62 and 64. Resitor 80 can be connected to capacitor 58 through a field effect transistor 82, under the control of a second digital control signal. In other words, a two-bit digital control signal is used, whereby the LF signal frequency can be selected to three or more different values. The logic level potentials of the two bits of the operating signal in this case need not be identical.

Figure 6:
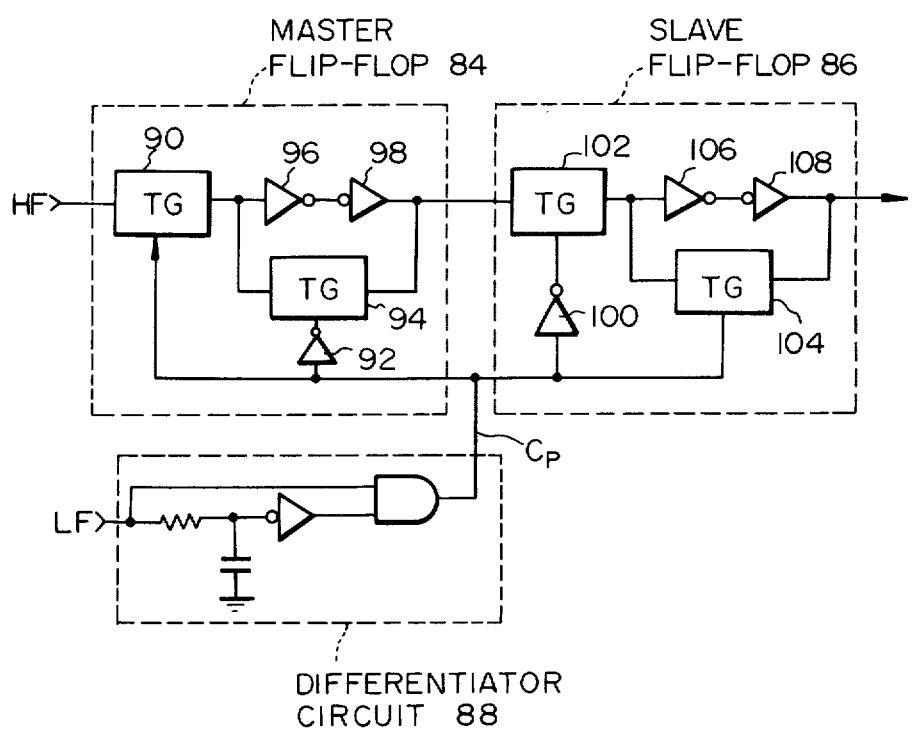
FIG. 6 is a circuit diagram of phase comparator embodiment which utilizes transmission gates and inverters, and a differentiator circuit for producing clock pulses of short duration from the relatively low frequency signal.

Referring now to FIG. 6, and embodiment of the data-type flip-flop 14 of the embodiment of FIG. 3A is shown, which is directed towards reducing the power consumption of that flip-flop circuit. It is basically a master-slave type of flip-flop, comprising a master flip-flop 84 and a slave flip-flop 86. Power consumption is reduced by reducing the duty cycle of the LF signal before it is applied to the data-type flip-flop circuit as a clock pulse. This duty cycle reduction is performed by means of a differentiatior circuit 88, which basically consists of an integrator circuit and an inverter connected to a gate. The master and slave flip-flop sections 84 and 86 are made up of combinations of transmission gates and inverters. The HF signal is input to the master flip-flop 84 only when the clock signal Cp goes to the high logic level, and is isolated from being input at all other times. Since the duty cycle of the clock pulses Cp can be made extremely low, the power consumed by the high frequency signal acting upon the components of the master flip-flop is considerably reduced, since this power consumption is primarily determined by the frequency of the signals processed by the circuitry. The latter point is particularly important in the case of complementary MOS type circuit elements. The output of the master flip-flop 84, memorized therein, are latched into the slave flip-flop 86 when the clock signal Cp goes to the low logic level.

From the above, it will be appreciated that the present invention enables a timebase signal generating circuit for an electronic timepiece to be produced which provides the advantages of the excellent frequency stability of a high frequency crystal oscillator circuit yet without the penalty of a high degree of power consumption in frequency divider stages acting upon the high frequency output signal of the HF oscillator. A relatively low frequency signal is obtained which is locked to a frequency which is an integral sumbmultiple of that of the high frequency signal, and this low frequency signal can then be readily frequency divided to obtain a unit time signal, with no greater power consumption than that of a conventional electronic timepiece utilizin a relatively low frequency crystal-controlled oscillator as a timebase signal source. The advantages of a phase locked loop circuit are provided by the timebase signal source circuit of the present invention, but by a circuit which is considerably simpler than a conventional type of phase locked loop circuit, and which is readily applicable to the mass production techniques of electronic timepiece manufacture.

It should be noted that it is also possible to modify the embodiments of the present invention described herein such that the digital feedback control signal is caused to vary the frequency of the LF signal in such a way as to compensate for the temperature-frequency characteristics of the high frequency oscillator circuit.

It will now be appreciated from the foregoing description that in accordance with the present invention the HF and LF signals periodically coincide in phase. By alternately increasing and decreasing the frequency of the LF signal by a small factor $\alpha$, the time base signal is obtained whose frequency is stabilized to be an integral submultiple of the HF signal.

Although the present invention has been shown and described with respect to specific embodiments, it should be noted that various changes and modifications of these embodiments are possible, which come within the scope claimed for the present invention.

What is claimed is:

1. In an electronic timepiece having a timebase signal source for producing a standard timebase signal, a frequency divider responsive to said timebase signal for producing a unit time signal, timekeeping circuit means responsive to said unit time signal for producing time information and display means for displaying said time information, the improvement whereby said timebase signal source comprises:

a high frequency oscillator circuit for producing a relatively high frequency signal, the frequency of said relatively high frequency signal being stable to a substantially high degree;

an electronically controlled oscillator circuit for producing a relatively low frequency signal serving as said timebase signal;

a phase comparator circuit for comparing the phase of said relatively high frequency signal with that of said relatively low frequency signal and for producing a phase comparison signal indicative of a phase relationship between said relatively high and low frequency signals;

a feedback signal generation circuit responsive to said phase comparison signal for producing a digital feedback signal, said digital feedback signal being at a first logic level potential while the phase of said relatively low frequency signal is leading the phase of said relatively high frequency signal and being at a second logic level potential while the phase of said relatively low frequency signal is lagging that of said relatively high frequency signal;

said digital feedback signal being applied as a frequency control signal to said electronically controlled oscillator circuit which is responsive to said second logic level potential state of said digital feedback signal for determining the frequency of said relatively low frequency signal to have a value which is equal to that of said relatively high frequency signal multiplied by a factor comprising the sum of a predetermined integer and a first positive real number with value less than one, said electronically controlled oscillator circuit being further responsive to said first logic level potential state of said digital feedback signal for determining the frequency of said relatively low frequency signal to have a value which is equal to that of said relatively high frequency signal multiplied by a factor comprising the difference between said predetermined integer and a second positive real number with value less than one.

2. The improvement according to claim 1, in which said phase comparator circuit and said feedback signal generation circuit each comprise flip-flop circuits.

3. The improvement according to claim 2, in which said phase comparator circuit comprises a data-type flip-flop circuit having said relatively low frequency signal applied to a clock signal input terminal thereof and said relatively high frequency signal applied to a data signal input terminal thereof.

4. The improvement according to claim 2, in which said feedback signal generation circuit comprises a toggle-type flip-flop circuit having said phase comparison signal applied to a toggle signal input terminal thereof.

5. The improvement according to claim 1, in which said electronically controlled oscillator circuit comprises a quartz crystal-controlled oscillator circuit including:
 a quartz-crystal frequency-controlling element;
 a first capacitor coupled between a first terminal of said quartz crystal element and earth potential;
 first and second transmission gates coupled in common to another terminal of said quartz crystal element;
 first and second capacitors, connected respectively between inputs of said first and second transmission gates and earth potential;
 said digital feedback signal being applied to control input of said first transmission gate and applied in inverted form to a control input of said second transmission gate, whereby said first capacitor is connected to said quartz crystal element when said digital feedback signal is at a first logic level potential, and whereby said second capacitor is connected to said quartz crystal element when said digital feedback signal is at a second logic level potential.

6. The improvement according to claim 1, in which said electronically controlled oscillator circuit comprises an oscillator circuit whose frequency of oscillation is determined by a combination of resistive and capacitative elements, and which comprises a switching element coupled to at least one of said resistive and capacitative elements for controlling the effective value thereof in accordance with the logic level potential of said digital feedback signal, said digital feedback signal being applied to a control terminal of said switching element to control the operating state thereof.

7. The improvement according to claim 6, in which said switching element comprises at least one field effect transistor.

8. The improvement according to claim 1, and further comprising differentiator circuit means coupled between said electronically controlled oscillator circuit and said phase comparator circuit for producing a train of pulses of low duty cycle having identical phase and frequency to said relatively low frequency signal, and moreover comprising switching means provided at an input of said phase comparator and responsive to said low duty cycle pulses for transferring said relatively high frequency signal into said phase comparator circuit to be compared with said relatively low frequency signal phase.

9. The improvement according to claim 8, wherein said switching means comprises a transfer gate controlled by said low duty cycle pulses.

* * * * *